United States Patent
Manipatruni et al.

(10) Patent No.: US 10,553,268 B2
(45) Date of Patent: Feb. 4, 2020

(54) METHODS AND APPARATUS TO PERFORM COMPLEX NUMBER GENERATION AND OPERATION ON A CHIP

(71) Applicant: INTEL CORPORATION, Santa Clara, CA (US)

(72) Inventors: Sasikanth Manipatruni, Portland, OR (US); Ian Young, Portland, OR (US); Dmitri Nikonov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,308

(22) PCT Filed: Sep. 30, 2016

(86) PCT No.: PCT/US2016/054866
§ 371 (c)(1),
(2) Date: Feb. 18, 2019

(87) PCT Pub. No.: WO2018/063357
PCT Pub. Date: Apr. 5, 2018

(65) Prior Publication Data
US 2019/0189173 A1    Jun. 20, 2019

(51) Int. Cl.
*G11C 11/16* (2006.01)
*H01L 43/06* (2006.01)
(Continued)

(52) U.S. Cl.
CPC ...... *G11C 11/161* (2013.01); *H01L 29/66984* (2013.01); *H01L 29/82* (2013.01); *H03K 19/16* (2013.01); *H03K 19/18* (2013.01)

(58) Field of Classification Search
None
See application file for complete search history.

(56) References Cited

U.S. PATENT DOCUMENTS

| 2006/0146601 A1 | 7/2006 | Miltat et al. |
| 2008/0205123 A1 | 8/2008 | Wu et al. |

(Continued)

FOREIGN PATENT DOCUMENTS

WO    2014078025    5/2014

OTHER PUBLICATIONS

International Searching Authority, "Search Report and Written Opinion," issued in connection with PCT Patent application No. PCT/US2016/054866, dated May 24, 2017, 11 pages.
(Continued)

*Primary Examiner* — Jany Richardson
(74) *Attorney, Agent, or Firm* — Green, Howard & Mughal, LLP

(57) ABSTRACT

Methods and apparatus for complex number generation and operation on a chip are disclosed. A disclosed logic device includes a first magnet with a first preferred direction of magnetization to polarize a spin of electrons in the first direction. The example logic device includes a second magnet with a second preferred direction of magnetization that polarizes a spin of electrons in the second direction. The example logic device includes a third magnet providing a free layer without a preferred direction of magnetization that is connected to the first and second magnets, wherein the third magnet encodes a vector based on a flux of electrons spin polarized in the first direction and a flux of electrons spin polarized in the second direction.

20 Claims, 9 Drawing Sheets

(51) Int. Cl.
*H03K 19/16* (2006.01)
*H03K 19/18* (2006.01)
*H01L 29/66* (2006.01)
*H01L 29/82* (2006.01)

(56) References Cited

U.S. PATENT DOCUMENTS

| | | |
|---|---|---|
| 2012/0176154 A1 | 7/2012 | Behin-Aein et al. |
| 2014/0103473 A1 | 4/2014 | Kent et al. |
| 2016/0118099 A1* | 4/2016 | Khitun ................ G11C 11/1673 365/158 |
| 2016/0141333 A1* | 5/2016 | Bandyopadhyay ... H01L 27/222 365/158 |
| 2017/0069831 A1* | 3/2017 | Nikonov ................ H01L 43/08 |

OTHER PUBLICATIONS

Liu, L. et al. "Spin-Torque Ferromagnetic Resonance Induced by the Spin Hall Effect", Phys. Rev. Lett. 106.036601 (2011), Cornell University, Ithaca, New York, 14853, 4 pgs.
Sanchez, J.C. Rojas et al. "Spin-to-charge conversion using Rashba coupling at the interface between non-magnetic materials", Nature Communications, published on Dec. 7, 2013; 7 pages. www.nature.com/naturecommunications; DOI: 10.1038/ncomms3944.
Su, S. et al. "Computer Minimization of Multivalued Switching Functions", IEEE Transactions on Computers, 100.9 (1972). pp. 995-1003.

* cited by examiner

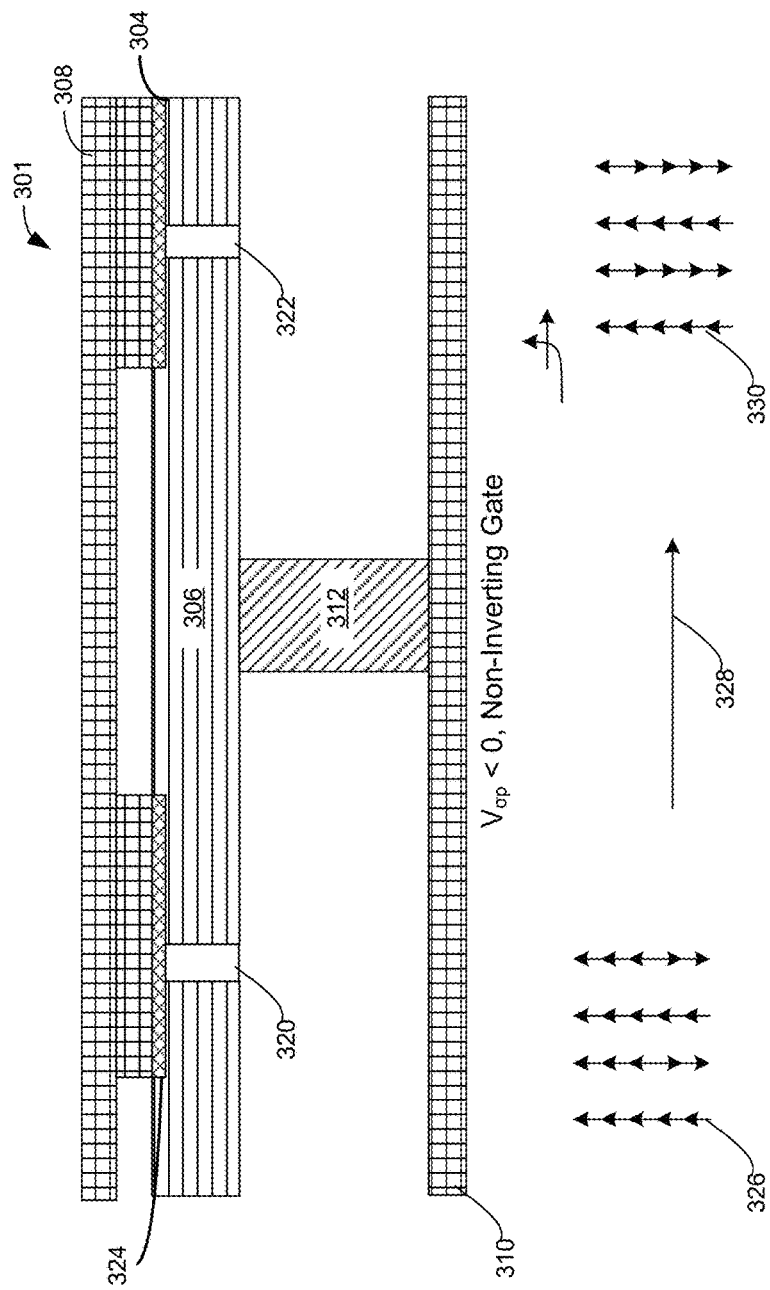
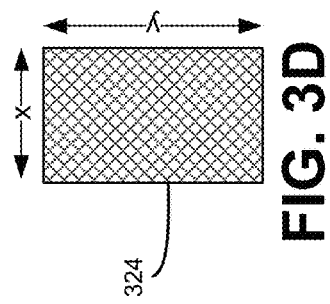
FIG. 3C
FIG. 3D

METHODS AND APPARATUS TO PERFORM COMPLEX NUMBER GENERATION AND OPERATION ON A CHIP

CROSS-REFERENCE TO RELATED APPLICATIONS

This patent is a nationalization of International Patent Application Serial No. PCT/US2016/054866 which was filed on Sep. 30, 2016, and entitled "Methods and Apparatus to Perform Complex Number Generation and Operation on a Chip". International Application Serial No. PCT/US2016/054866 is hereby incorporated herein by reference in its entirety.

FIELD OF THE DISCLOSURE

This disclosure relates generally to semiconductors, and, more particularly, to methods and apparatus to perform complex number generation and operation on a chip.

BACKGROUND

Spintronic logic represents an improvement over complementary metal-oxide-semiconductors (CMOS) logic, memory and analog applications because of its low power consumption. A spintronic device includes a dominant magnet that injects a net spin into an output current forcing output electrons to align their spins. Aligning the spin of electrons in the output results in an excess of spin up or spin down electrons.

FIG. 1A illustrates an example branch 100 of a generic circuit including two nodes 110, 115 connected by a scalar conduction element 120. In the example branch 100 of FIG. 1A, a scalar current 130 passes along the conduction element 120 between nodes 110, 115, sending electrons 140 flowing along the conduction element 120 between nodes 110, 115.

FIG. 1B illustrates an example circuit branch 150 including nodes 160, 165 connected by a spin conductance element 170 in a spin circuit. In the example of FIG. 1B, a vector spin current 180 in the branch 150 of a spin circuit is the net vector flow of electrons 190 associated with a magnetic moment between the nodes 160, 165. The vector spin current 180 is represented by a three dimensional tensor described by a direction of the flow of the charges constituting the spin current 180 and a direction of the net magnetic moment (spin) of the charges along each Cartesian coordinate axis (x, y, z). The total spin current vector is a combination of the charge current and vector spin current in a vector (e.g., a 4×1 vector, etc.) for example. The electrons 190 associated with the spin current 180 have a spin or polarization including one or more of an x, y, or z component.

A vector spin voltage is a state variable associated with an accumulation of spins of a certain direction. The spin voltage is proportional to a net spin population. For example, the total spin voltage vector is a combination of a scalar columbic potential and a vector spin potential in a vector (e.g., a 4×1 vector, etc.).

A spin conductance relates vector spin voltages to vector spin currents. The spin conductance can be represented by a spin conductance matrix. The spin conductance matrix of a conductance element is a matrix proportionality constant relating the vector spin current though an element with the vector spin voltage difference applied across the conductance element 170. For example, the spin conductance matrix can be represented as a 4×4 vector that scales and reorients the voltage vectors to obtain the spin current vector. The sixteen components of the example spin conduction matrix are non-zero and are set by the magnetic and geometric properties of the spin conductance element, for example.

However, current spintronic logic suffers from a lack of control and variability that reduce the utility of such logic to only basic operation.

BRIEF DESCRIPTION OF THE DRAWINGS

FIGS. 3A-3D show cross-sections of example spin logic device configurations and associated magnets to enable representation and/or manipulation of scalar, complex, and vector numbers and products on a chip.

Figure 1A:
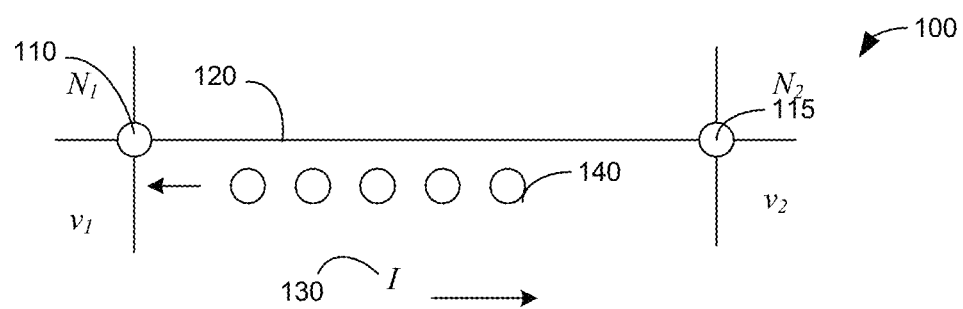
FIGS. 1A-1B illustrate spin logic principles.
Figure 1B:
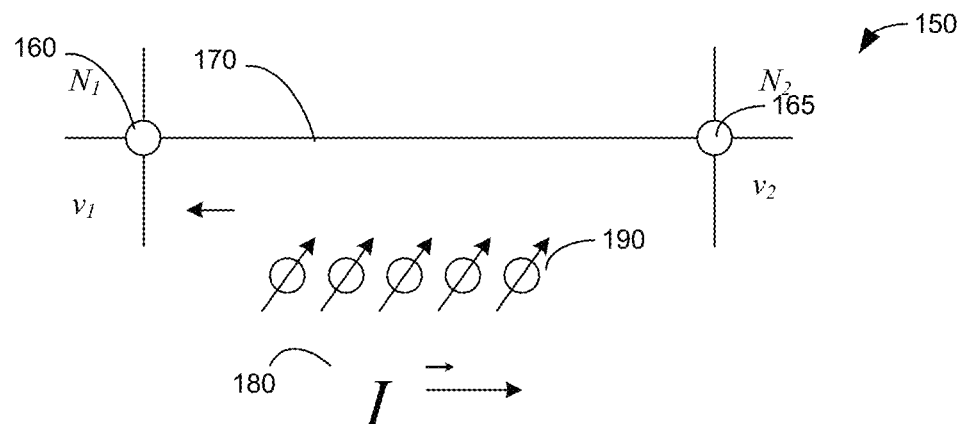

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and/or other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Methods and apparatus to perform complex number generation and operation on a chip are provided. Methods and apparatus to perform complex number generation and operation using spin logic on a chip are provided.

Spintronic CMOS integrated circuits (ICs) provide non-volatility, superior energy delay, higher logical efficiency, reconfigurability, and suitability for novel computational architectures and logic-memory paradigms. Certain examples provide spintronic CMOS ICs to enable extreme scalability of memory, logic and interconnect density, for example. Using spin logic provides a scaling path for logic circuit density using Boolean spin logic devices, spin Hall Effect devices, etc.

By enabling complex number representation and algebra on chip, representation of complex numbers and vectors is enabled. Using complex numbers and vectors through spin logic facilitates vector algebra on computational variables, for example. Additionally, complex number and vector representation using spin logic extends 4-state spin variables to an arbitrary spin angle, for example. Spin logic representation of complex numbers and vectors captures the vector algebra potential of a spin state variable, for example.

Thus, certain examples enable representation of complex numbers on chip and representation of vector variables on chip. Certain examples facilitate direct manipulation of complex and vector measured quantities. Certain examples provide vector and scalar product implementation on chip.

Figure 2:
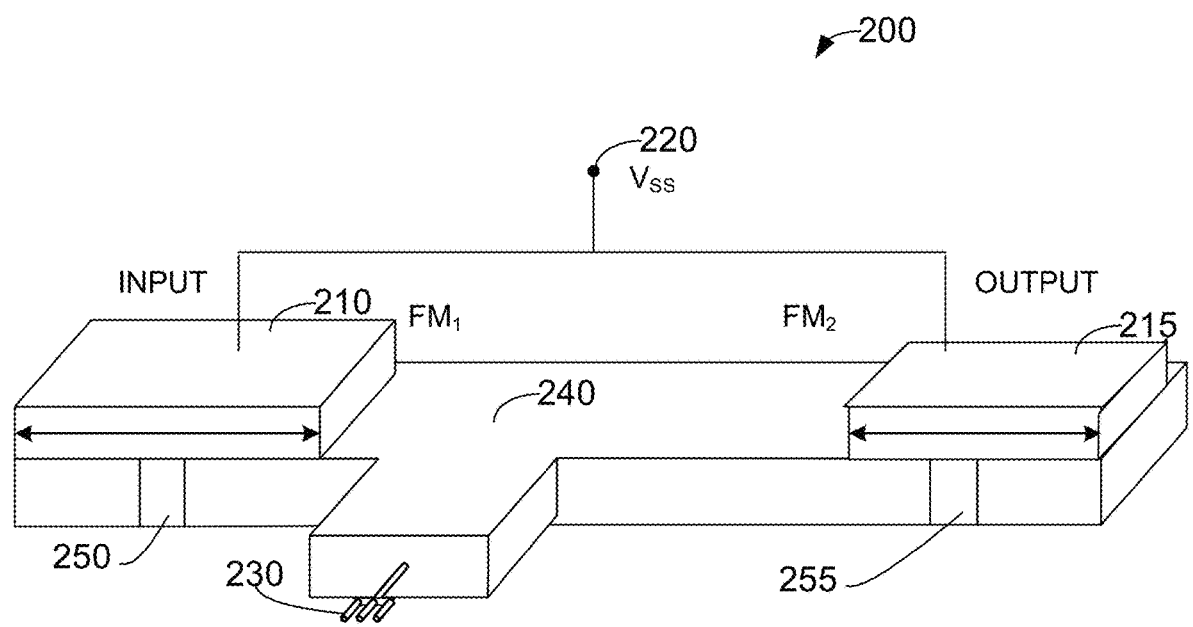
FIG. 2 illustrates an example device including input and output magnets connected to a voltage source.

For example, as shown in the example device 200 of FIG. 2, identical input (FM1) and output (FM2) ferromagnets 210, 215 are connected to a common voltage source VSS 220 that drives a charge current across the ferromagnets 210, 215 to a ground contact 230 through a common non-magnetic channel 240. Although both magnets 210, 215 are connected to the same voltage 220, a spin current ($\vec{I}_s$) is exchanged between the magnets 210, 215 based on the application of the voltage 220 across the device 200 and interaction of the magnetic fields of the magnets 210, 215. Positioning of the ground 230 closer to the magnet 210 causes electron flow to the magnet 215 as part of the induced spin current. The regions 250, 255 under the magnets 210, 215 represent isolation layers in a conducting region of the channel 240 that ensure that communication between the two magnets 210, 215 is limited to the channel segment 240 between the two magnets 210, 215. Therefore, each magnet 210, 215 can interact independently with different magnets on either side. This allows each magnet 210, 215 to act as both an input and an output by having a "talking" side that behaves as an input to a subsequent stage, and a "listening" side that behaves as an output to a previous stage, thereby providing cascaded all-spin-logic structures.

In certain examples, when the supply voltage 220 VSS=0, the two magnets 210, 215 can exist in any of four possible states denoted as 00, 01, 10, 11 (FM1: first bit, FM2: second bit). However, when VSS 220 is increased beyond a positive threshold value, the stable states are those for which the two magnets 210, 215 are anti-parallel, namely 01 and 10. On the other hand, if VSS 220 is negative beyond a certain threshold value, the stable states are those for which the two magnets 210, 215 are parallel, namely 00 and 11. In certain examples, VSS 220 can be negative when an inversion is desired (e.g., multiply by a negative factor, etc.). The voltage 220 can be switched on or off via a transistor, capacitor, etc., for example. Processing flows with the current from input 210 to output 215 according to spin polarization value(s).

An example lateral spin logic device can be implemented similar to the device 200 to include at least two nanomagnets 210, 215 and one or more non-magnetic channels 240. The channel 240 acts as an interconnect between the two magnets 210, 215 and transports spin polarized currents. The magnets 210, 215 create spin polarized population densities underneath the magnets 210, 215 and establish spin diffusion currents through the channel 240. The direction of the spin diffusion current is set by a relative strength of the spin polarization of the carriers (e.g., electrons). For a ground terminal 230 set near the input magnet 210, the magnet 210 acts as a fixed magnetic terminal, while the output magnet 215 responds to the spin diffused beneath it according to an applied voltage. For a positive applied voltage 220, the spin logic device 200 acts like an inverting gate, where the output becomes a logical invert of the input. For a negative applied voltage 220, the output becomes a copy of the input magnet's condition. The connecting channel 240 between the magnets 210, 215 includes a sectioned structure to isolate spin logic gates, where the interconnection between gates is achieved via a continuous free layer magnet (not shown).

Figure 3A:
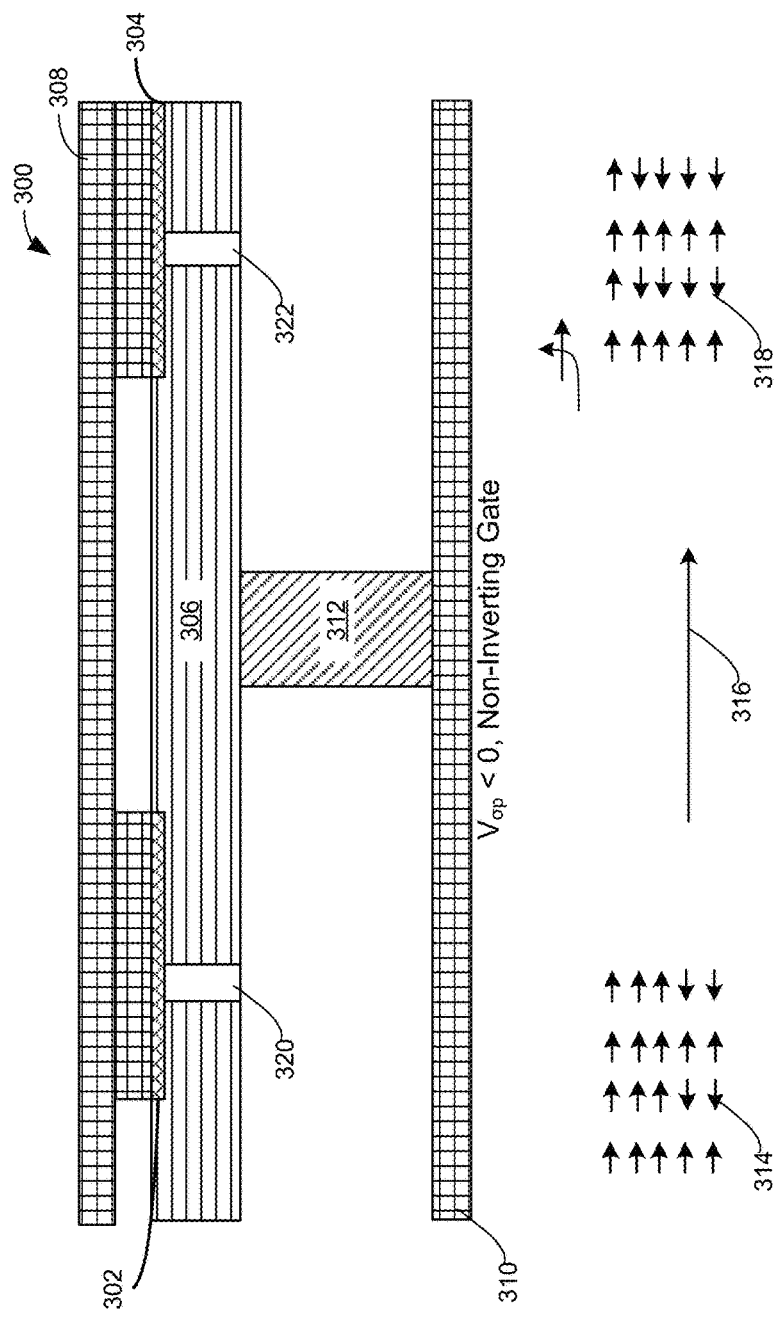
Figure 3B:
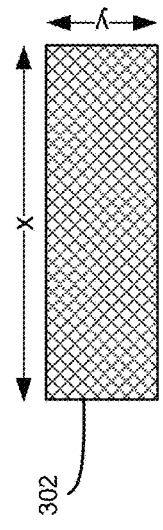

FIGS. 3A-3B show cross-sections of an example spin logic device configurations to enable representation and/or manipulation of scalar, complex, and vector numbers and products on a chip. The examples of FIGS. 3A-3B leverage the above description to harness spin polarization effects to represent and manipulate scalar, complex and/or vector numbers and products.

FIG. 3A illustrates an example spin logic device 300 including magnets 302, 304. The magnets 302, 304 are nanomagnets (e.g., nanometer-scale ferromagnets such as alloys of Cobalt (Co), Nickel (Ni), Iron (Fe), etc., and/or multi-layer structures with Platinum (Pt), Palladium (Pd), Heusler alloy, etc.). In the example of FIG. 3A, the magnet 302 has a defined direction of magnetization based on a shape of the magnet. For example, the nanomagnet 302 can be formed with an elliptical or rectangular shape. A preferred or dominant direction of magnetization is oriented along the longest axis of the rectangle/ellipse. Therefore, the magnet 302 can be spin polarized along a longer x-axis of the magnet 302, or the magnet 302 can be spin polarized along a longer y-axis of the magnet 302. The magnet 304 is a "free layer" magnet having a more uniform shape (e.g., a circle, square, etc.) and, therefore, no preferred or dominant direction of magnetization. The free magnet 304 can instead be influenced by an influx of electrons having a particular spin.

Current(s) can be added to magnets by attaching wires to a device, such as a capacitor (not shown) to charge the capacitor, and the charge in the capacitor is proportional to the resulting charge current(s). Alternatively or in addition, other mechanisms to generate a voltage between the top channel 308 and the bottom channel 310 can be applied. Magnetization in the magnet is converted to a spin polarized current of the same direction and passes into the channel or wire for the signal to propagate. The spin relates to a direction of the magnetic moment of the electron. The magnetic moment is opposite to the spin due to a negative charge of the electron. A spin polarized current from the magnet 302 sets the magnetization of the magnet 304 in the next stage.

The magnets 302, 304 are connected to a channel 306, which is a non-magnetic (e.g., Copper (Cu), Aluminum (Al), Silver (Ag), graphene, etc.) wire positioned under the magnets 302, 304. Additional channels (e.g., copper wires, etc.) 308, 310 apply a voltage, V, between the top channel 308 and bottom channel 310 of the example device 300. The applied voltage causes a current to flow from the top channel 308 to the bottom channel 310 via a channel 312. When the current passes through each magnet 302, 304, the electron spins are polarized (e.g., as indicated by arrows 314-318 at the bottom of FIG. 3A) in areas 320, 322 under the magnets 302, 304. The polarized spin creates a diffusion 316 of electrons with a particular spin along the channel 306 from left 314 to right 318. A flux of spin polarized electrons 318 entering the magnet 304 sets a direction of magnetization in the magnet 304.

The example device 300 of FIG. 3A illustrates an example configuration of a circuit with a plus or minus (+/−) x direction at the input magnet 302 producing a plus or minus x direction at the output magnet 304. As shown in the example of FIG. 3B, the magnet 302 is configured such that a dimension of the magnet 302 along the x-axis is greater than a dimension of the magnet 302 along the y-axis.

FIG. 3C illustrates an example device configuration 301 in which a flow of electrons 326-330 from the magnet 324 to the magnet 304 has a polarization in they direction such that a plus or minus (+/−) y direction at the input magnet 302 produces a plus or minus y direction at the output magnet 304. As shown in the example of FIG. 3D, the magnet 324 is configured such that a dimension of the magnet 324 along the y-axis is greater than a dimension of the magnet 302 along the x-axis.

A spin current has a value according to a magnitude of that current, and the current is polarized by a spin in the dominant direction of the magnet 302. Thus, the current provided by the magnet 302 is represent as ax (if the dominant direction of magnetization is along the x-axis) or by (if the dominant direction of magnetization is along the y-axis), where a and/or b coefficient values are determined based on the magnitude of the spin current generated by the magnet, for example. In its turn, the magnitude of the spin current delivered from the input magnet to the output (target) magnet is proportional to the charge current conducted through the input magnet to the ground. The magnitude of the spin current is also influenced by the length of the channel from the input to the output magnets; due to spin relaxation in the channel the degree of spin polarization attenuates as an exponential function of channel length. In some examples, two magnets 302 can be used to provide both ax and by values. Using two magnets 302, the x-value provided by a first magnet 302 represents a real part of a complex number, and the y-value provided by a second magnet 302 represents an imaginary part of the complex number. Thus, together, spin values from the two magnets 302 can be used to represent a complex number: ax+by.

The free layer magnet 304 is polarized according to a combination of the magnetic directions of the output current from one or more magnets 302. Electrons from current of a particular magnitude (e.g., according to applied voltage V) are polarized according to a particular spin to represent a number encoded by a certain direction of magnetization and stored by the free layer magnet 304. That is, the resulting polarization of magnet 304 has an x and/or y component contributed by the magnet(s) 302. Thus, the magnet 304 can produce a scalar and/or complex value represented by ax, by, and/or ax+by, for example.

FIGS. 4A-4F illustrate example spin logic device configurations to enable representation and/or manipulation of scalar, complex, and vector numbers and products on a chip. The examples of FIGS. 4A-4F leverage the above description to harness spin polarization effects to represent and manipulate scalar, complex and/or vector numbers and products.

Figure 4A:
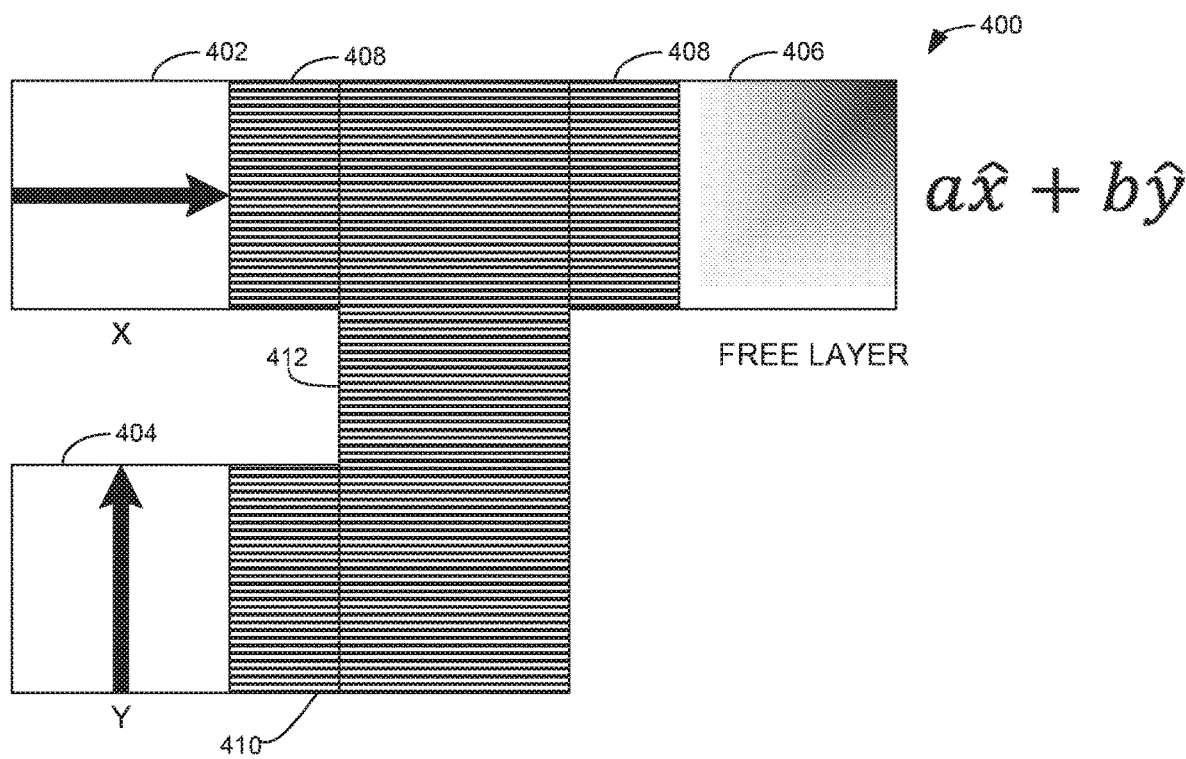
FIGS. 4A-4F illustrate example spin logic device configurations to enable representation and/or manipulation of scalar, complex, and vector numbers and products on a chip.

FIG. 4A illustrates an example spin logic device 400 including magnets 402, 404, and 406. The magnets 402, 404 are nanomagnets having a defined direction of magnetization based on a shape of the magnet. For example, each nanomagnet 402, 404 can be formed with an elliptical or rectangular shape. A preferred or dominant direction of magnetization is oriented along the longest axis of the rectangle/ellipse. Therefore, as shown in the example of FIG. 4A, the magnet 402 is spin polarized along a longer x-axis of the magnet 402, and the magnet 404 is spin polarized along a longer y-axis of the magnet 404. The magnet 406 is formed in a more equal-sided shape (e.g., circle, square, etc.) so as to be a "free layer" without a preferred direction of magnetization (e.g., any direction has approximately the same energy).

In the example of FIG. 4A, the x-value provided by the magnet 402 represents a real part of a complex number, and the y-value provided by the magnet 404 represents an imaginary part of the complex number. Thus, together, as maintained in their respective spin polarized carriers by the magnet 406, spin values from the magnets 402, 404 can be used to represent a complex number: ax+by.

Each magnet 402, 404 is connected to a channel 408, 410, which is a non-magnetic (e.g., copper) wire positioned under the magnet 402, 404. The channels 408, 410 are connected by a third channel 412 so that spin current from both magnets 402, 404 can flow to the free layer magnet 406. Each spin current has a value according to a magnitude of that current, and each current is polarized by a spin in the dominant direction of the respective magnet 402, 404. Thus, the current provided by the magnet 402 is represent as ax, and the current provided by the magnet 404 is represented as by, for example. The free layer magnet 406 is polarized according to a combination of the magnetic directions of the output current from magnets 402 and 404. That is, the resulting polarization of magnet 406 has an x component contributed by the magnet 402 and a y component contributed by the magnet 404. Thus, the magnet 406 stores a complex value represented by ax+by, for example.

Figure 4B:
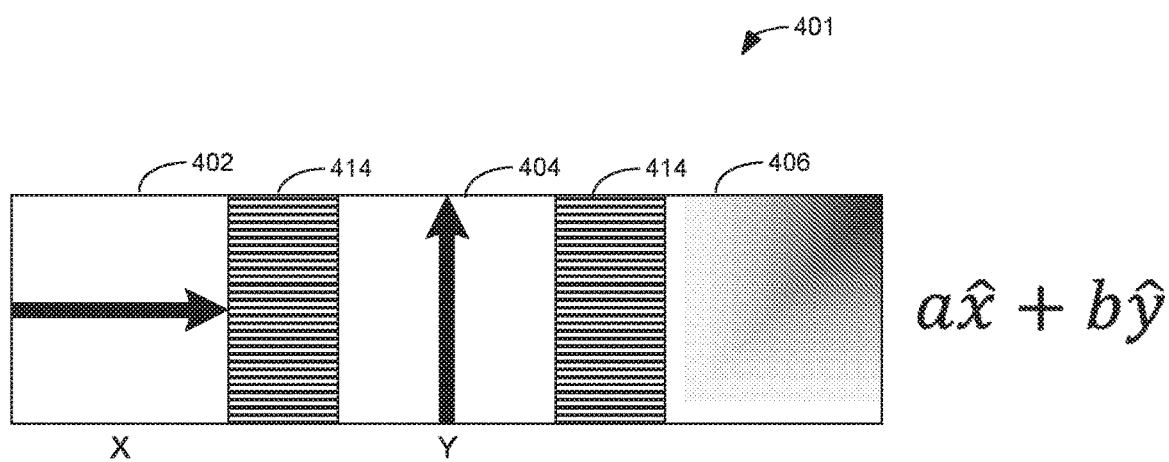

FIG. 4B illustrates an alternative device configuration 401 of magnets 402, 404, 406. In the example of FIG. 4B, the magnets 402, 404 are both in line with the free layer magnet 406 via a common channel 414. While FIG. 4B shows a more compact organization for the circuit 401, as with example FIG. 4A, spin currents are injected along fixed axes chosen as x and y axes with magnets 402 and 404, respectively, to generate a combined ax+by value using spin currents and polarization in the free layer magnet 406. Thus, spin polarized carriers, having a certain strength or concentration, a, enter along an x axis at magnet 402 and diffuse toward the free layer magnet 406, and, similarly, spin polarized carriers are injected at a certain concentration, b, along a y axis at magnet 404 and diffuse toward the magnet 406. Gradients are formed for electrons polarized on the x and y axes based on a difference in concentration to arrive at the combined ax+by value at magnet 406.

Figure 4C:
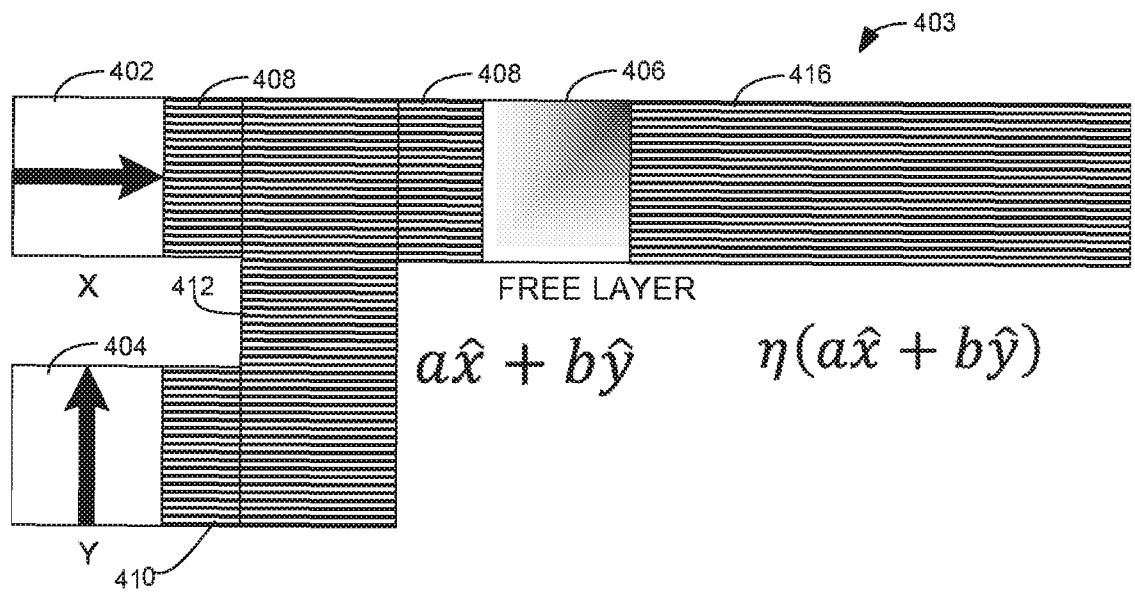

FIG. 4C illustrates an example circuit configuration 403 to facilitate multiplication of a vector with a scalar quantity using spin current polarization. As in FIGS. 4A-4B, an x value and a y value are generated using spin currents from magnets 402, 404 and transferred via channels 408, 410, 412 to the free magnet 406. In the example of FIG. 4C, magnets 402, 404 provide spin polarized carriers at certain angle to the x-axis (magnet 402) and y-axis (magnet 404) which encode a vector representing a number (e.g., a complex number, etc.). The magnet 406 injects the encoded carriers into a subsequent channel 416 which combines the encoded vector (e.g., a complex number represented by the amount of electron carriers in the x and/or y directions, etc.) stored by the magnet 406 with an amount of current passed through the free layer ferromagnet 406. The added current through the magnet 406 multiplies the complex number, for example, by a scalar value associated with the amount of the current. The scalar value can be positive or negative (e.g., a scalar value of −1 provides an additive inverse). Thus, a flux of spin polarized carriers magnetized at an angle to the x and y axes has an adjusted absolute value based on a number associated with the current added through the magnet 406 to provide: n(ax+by).

Figure 4D:
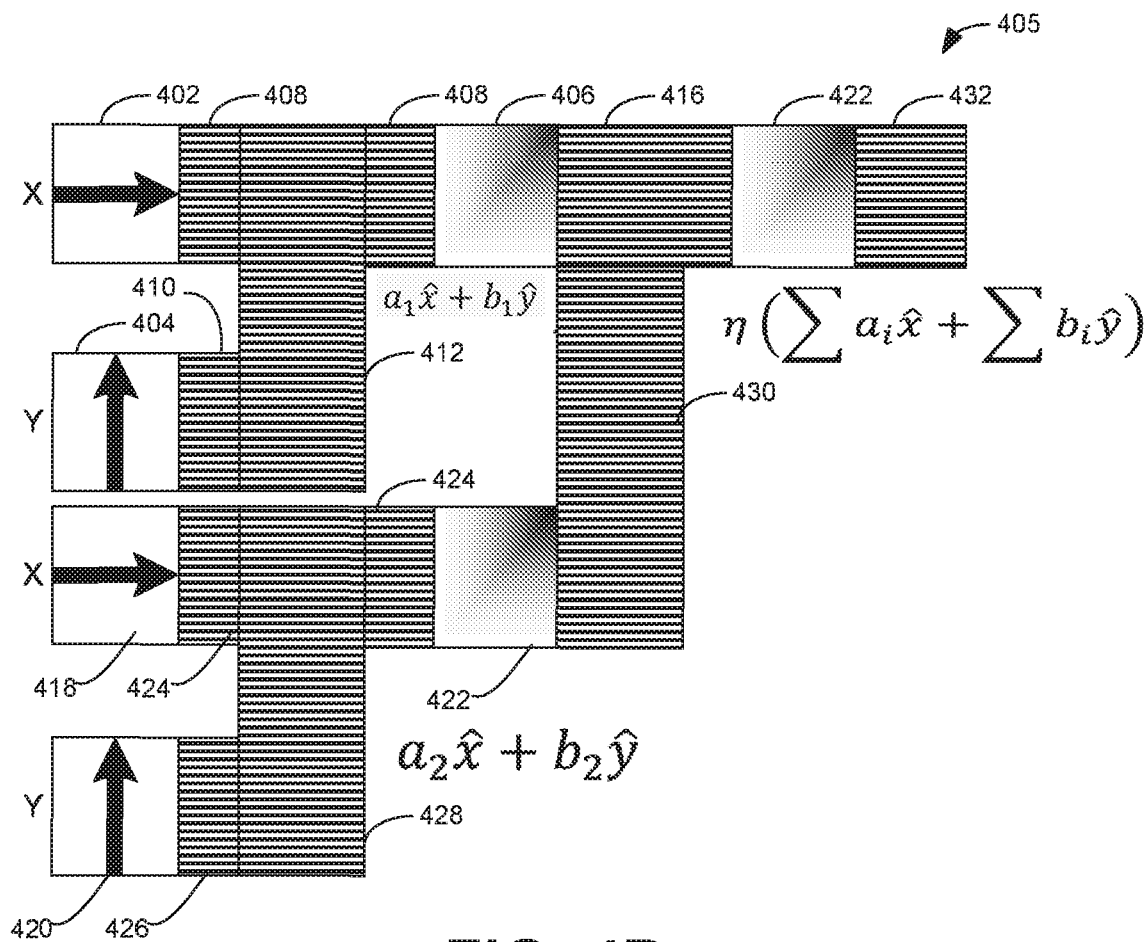

FIG. 4D shows a device 405 configuration to enable addition and subtraction of multiple vectors (e.g., two vectors, etc.). As shown in the example of FIG. 4D, a first vector is produced by the top pair of input magnets 402, 404 in conjunction with the free magnet 406, and a second vector is produced by the bottom pair of input magnets 418, 420 in conjunction with a free magnet 422. The magnet 402 provides spin polarized carriers representing a value $a_1x$ via channel 408 joined by spin polarized carriers representing a value $b_1y$ from the magnet 404 via channels 410, 412 to form a combined value $a_1x+b_1y$ at the magnet 406. Similarly, the magnet 418 provides spin polarized carriers representing a value $a_2x$ via channel 424 joined by spin polarized carriers representing a value $b_2y$ from the magnet 420 via channels 426, 428 to form a combined value $a_2x+b_2y$. A channel (e.g., copper and/or other metal wire) 430 carries the complex value $a_2x+b_2y$ to the channel 416 through which the complex value $a_1x+b_1y$ is provided by spin polarized carriers.

The magnet 422 then operates to sum or add the complex values $a_1x+b_1y$ and $a_2x+b_2y$ (or more to produce $a_ix+b_iy$ depending upon a number of magnets 402, 404, 418, 420, i, providing polarized charge to the magnet 422). Thus, a flux of spin polarized carriers on a first axis can be added to a flux of spin polarized carriers on a second axis to form a linear combination of vectors. As described above, adding a current to the free magnet 422 further serves to multiply the summed complex number by a scalar value proportional to the amount, n, of the current (e.g., $\eta(\Sigma a_1\hat{x}+\Sigma b_1\hat{y})$) to be provided to a subsequent device via an output channel 432. A charge current Ic applied to the top of a magnet multiplies the output spin polarized current by Ic magnitude. By inverting a value using a negative quantity (e.g., a scalar value of −1, etc.), vectors can be subtracted in addition to or instead of added, for example.

Figure 4E:
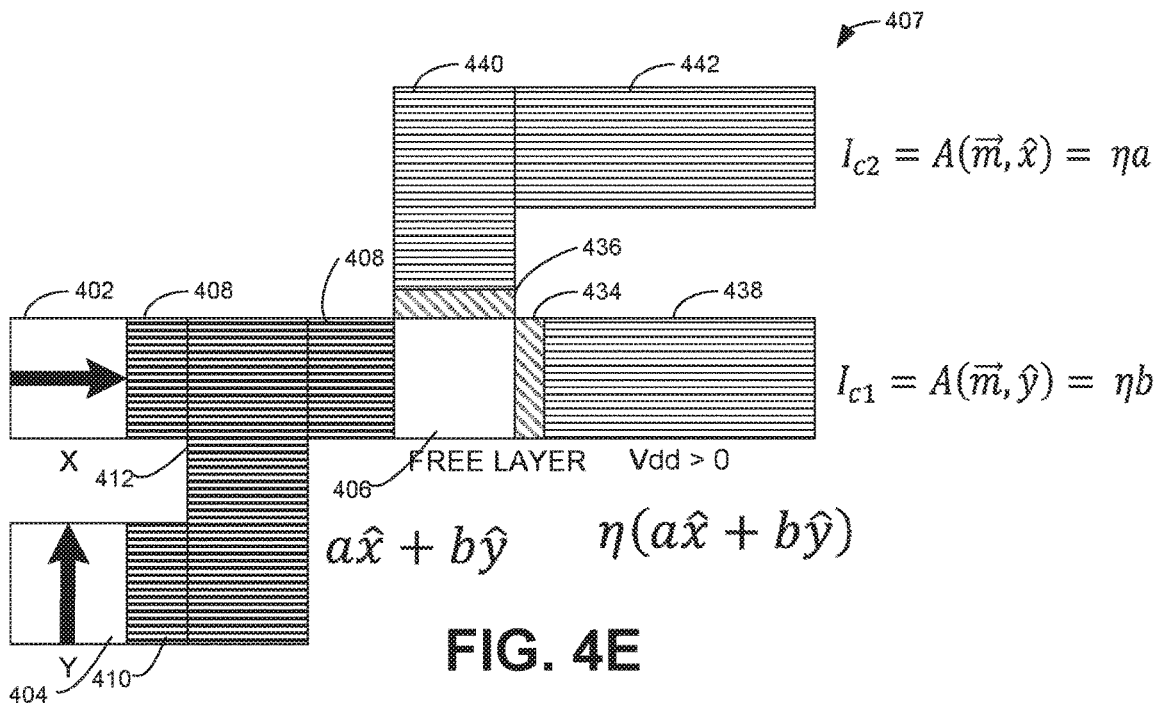

FIG. 4E provides a device 407 configuration to provide a projection of a vector along two chosen axes (e.g., the x-axis and y-axis, etc.). As shown in the example of FIG. 4E, magnets 402, 404 provide ax and by values, respectively, to the free layer magnet 406 via channels 408, 410, 412. Metal sections 434, 436 cause a projection vectors along a designated axis. The metal sections 434, 436 are formed from materials with spin orbital coupling to exhibit a spin Hall or Rashba effect. Examples of such materials include Tungsten (W), Tantalum (Ta), Platinum (Pt), Bismuth Sulfide ($Bi_2S_3$) and other topological insulators, superlattices such as a superlattice of repeated atomically thin Bismuth (Bi) layer on Silver layers.

A property of spin orbit materials is that they generate charge current in response to spin polarized current. The direction of charge current is perpendicular to both the direction of the spin polarized current and the direction of spin polarization. For example, the metal section 436 generates a value a from the x-projection ax of the spin polarized current (ax+by) provided by the magnet 402 with a certain factor n related to the efficiency of the spin orbit coupling. The metal section 434 generates a value b from the y-projection by of the spin polarized current (ax+by) provided by the magnet 404, for example. The metal sections 434, 436 provide a spin Hall or spin orbital effect such that a direction of the metal 434, 436 directly correlates to the spin direction for projection of electrons in a certain direction. The spin Hall Effect is an example of spin orbital coupling, which leads to an interaction of electrons to produce a coupling with the magnet 406 and orbital and/or translational motion of the electrons along a channel 438, 440, 442. The channels 438, 440, 442 are implemented as wires, for example, but may be a different metal than other channels 408, 410, 412, such as platinum, tantalum, titanium, tungsten, etc., rather than copper.

Thus, rather than deflecting electrons, the metal sections 434, 436 lock spin and momentum degree of freedom by selecting spin polarization based on a direction of current. The spin Hall Effect from the metal sections 434, 436 produces a charge current proportional to the projection of input spin polarization perpendicular to the direction of the output current. Using spin orbital coupling, spins can be selected based on a direction of translational motion of electrons in the metal 434, 436. For example, if a charge current is passed using a pipeline voltage from a top plane of the device 407 to a bottom plane of the device 407 (see, e.g., FIGS. 3A-3B) and through the ferromagnet 406, spin polarized electrons are produced moving vertically. However, after passing through the magnet 406, the electrons impact the metal section 434 and/or 436 with strong spin orbital coupling. Spin polarized carriers that are polarized in the y direction are deflected to travel in the x direction by the metal section 434, and spin polarized carriers that are polarized in x direction are deflected to travel in the y direction by the metal section 436.

If metal sections 434, 436 are magnetized at certain angle with projection on the x and y axes, respectively, the metal 434, 436 will produce spin polarized electrons traveling vertically with certain x and y axis projections, resulting in a charge current. In the example of FIG. 4E, a first charge current travels through the bottom channel 438 and is proportional to an amount of electrons spin polarized in the y direction: $I_{c1}=A(\vec{m},\hat{y})=\eta b$. A second charge current travels through the top channels 440, 442, and a magnitude of the charge current in the top channels 440, 442 (which becomes L-shaped through channels 440, 442) is proportional to an amount of electrons spin polarized in the x direction: $I_{c2}=A(\vec{m},\hat{x})=\eta a$.

Using the example configuration of the device 407 shown in FIG. 4E, a cross product of values can be calculated. For example, y-polarized electrons are deflected by the metal 438 to move in the x direction, and x-polarized electrons are deflected by the metal 440, 442 to move in the y direction. By bending the wires 438, 440, 442, the charged currents can be routed in a plurality of directions to other connected circuits connected to the wire channels 438, 442, for example.

Figure 4F:
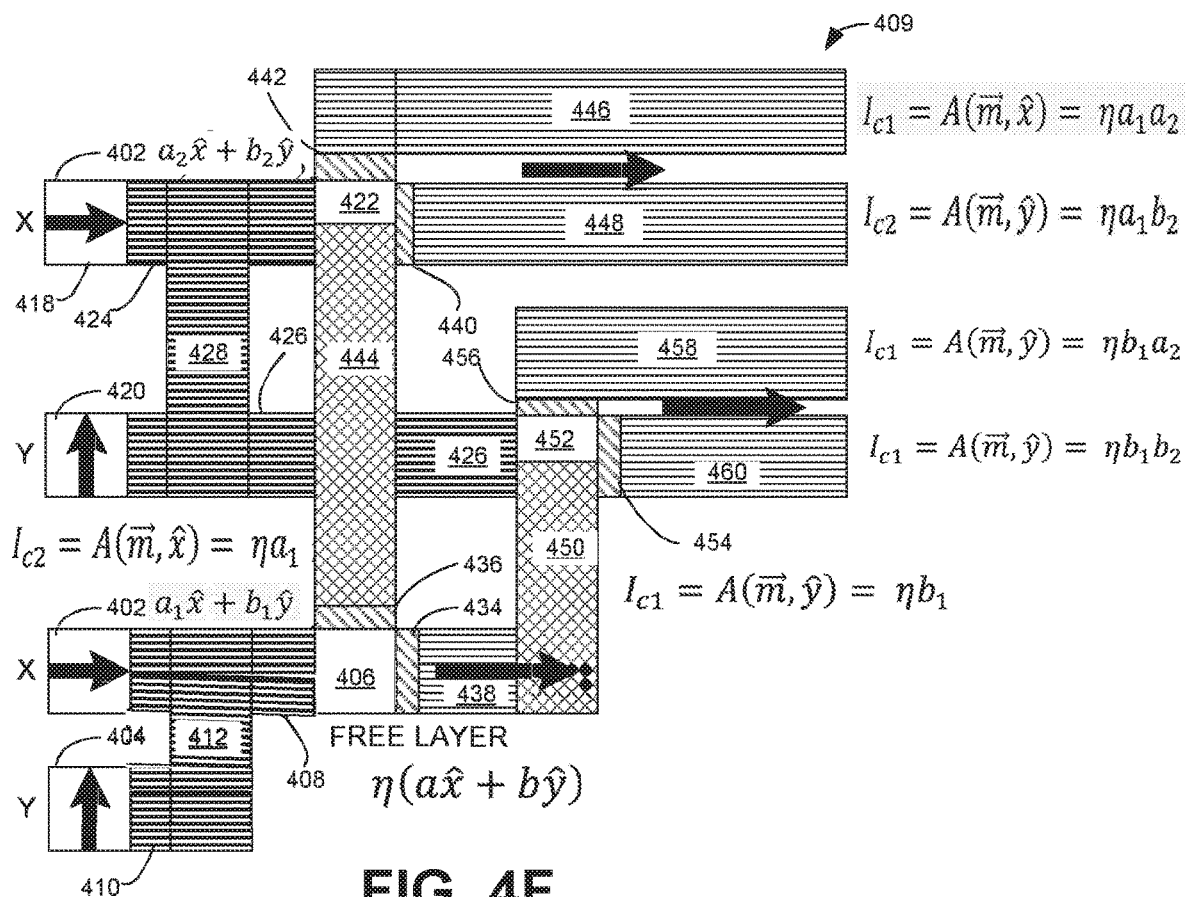

FIG. 4F illustrates an example configuration for the circuit 409 to generate vector and scalar products of two vectors. The example configuration of FIG. 4F shows a combination of algebraic manipulations (e.g., from the examples of FIGS. 4A-4E, etc.) applied to two vectors. In brief, using the example configuration of the device 409, two numbers can be added. Then, projections of the numbers can be obtained. Using the numbers and their projections, scalar and/or vector products can be formed.

In the example of FIG. 4F, the magnets 402, 404 generate an addition of numbers of $a_1x+b_1y$ at the free magnet 406. Application of an additional current at the magnet 406 can be used to multiple the complex number by a factor n to produce $n(a_1x+b_1y)$. The metal sections 434, 436 create charge currents proportional to the projections on the x (metal section 436) and y (metal section 434) axes of the above number.

Similarly, the magnets 418, 420 generate the complex number $a_2x+b_2y$ at the free magnets 422 and 452.

Charge current produced by the metal section 436 to form a projection in they direction can be routed along a channel to the magnet 422 as well. Then, when spin polarized electrons exit the magnet 422 and are deflected by the metal sections 440, 442, the spin polarized current includes the component from the free magnet 406 as well as the complex number from magnets 418, 420. As shown in the example of FIG. 4F, channels 446, 448 carry charge currents given by terms $I_{c1}=A(\vec{m},\hat{x})=\eta a_1 a_2$ and $I_{c2}=A(\vec{m},\hat{y})=\eta a_1 b_2$, respectively. These terms are used for the scalar (dot) product and the vector (cross) product of the two vectors.

Charge current produced by the metal section 434 to form a projection in they direction can be routed along a channel to the magnet 452 as well. Then, when spin polarized electrons exit magnet 452 and are deflected by the metal sections 454, 456, the spin polarized current includes the component from the free magnet 406 as well as the complex number from magnets 418, 420. As shown in the example of FIG. 4F, channels 458, 460 carry charge currents given by terms $I_{c1}=A(\vec{m},\hat{y})=\eta b_1 a_2$ and $I_{c1}=A(\vec{m},\hat{y})=\eta b_1 b_2$, respectively. These terms are used for the scalar (dot) product and the vector (cross) product of the two vectors.

Thus, using outputs from the channels 446, 448, 458, 460, scalar and/or vector products can be determined. By adding two numbers and then taking projections of the combination of numbers, two values can be provided to form scalar and/or vector products of the numbers. For example, taking output from channels 446 and 460, a scalar product is formed using an a projection of a first number and an a projection of a second number plus a b projection of the first number and a b projection of the second number. A difference between the values from channels 448 and 458 forms vector product. As a result, terms can be formed separately and added and/or subtracted to form scalar and/or vector products.

Outputs from the channels 446, 448, 458, 460 can be transmitted as analog signals embodied as charged currents to be processed further by additional circuitry/other device(s). Alternatively or in addition, elementary circuitry can be provided to add two products from channels 446, 448, 458, 460 to form a scalar product and/or subtract products for form a vector product and transmit one or both products to further circuitry/device(s).

Thus, in the example of FIG. 4F, x and y unit vectors provided by the magnets 402, 404, 418, 420 produce x/y combinations via magnets 406, 422, 452. Spin Hall areas created by metal sections 434, 436, 440, 442, 454, 456 create charge currents $\eta a_1$ and $\eta b_1$ used to produce spin polarized currents $\eta a_1(a_2x+b_2y)$ and $\eta b_1(a_2x+b_2y)$. The corresponding spin Hall areas produce charge currents via channels 446, 448, 458, 460 such as: $\eta a_1 a_2$, $\eta a_1 b_2$, $\eta b_1 a_2$, $\eta b_1 b_2$. Dot and cross products can be formed from these expressions:

$$(a_1x+b_1y)\cdot(a_2x+b_2y)=a_1a_2+b_1b_2;$$

$$(a_1x+b_1y)\cdot(a_2x+b_2y)=a_1b_2-b_1a_2.$$

Figure 5:
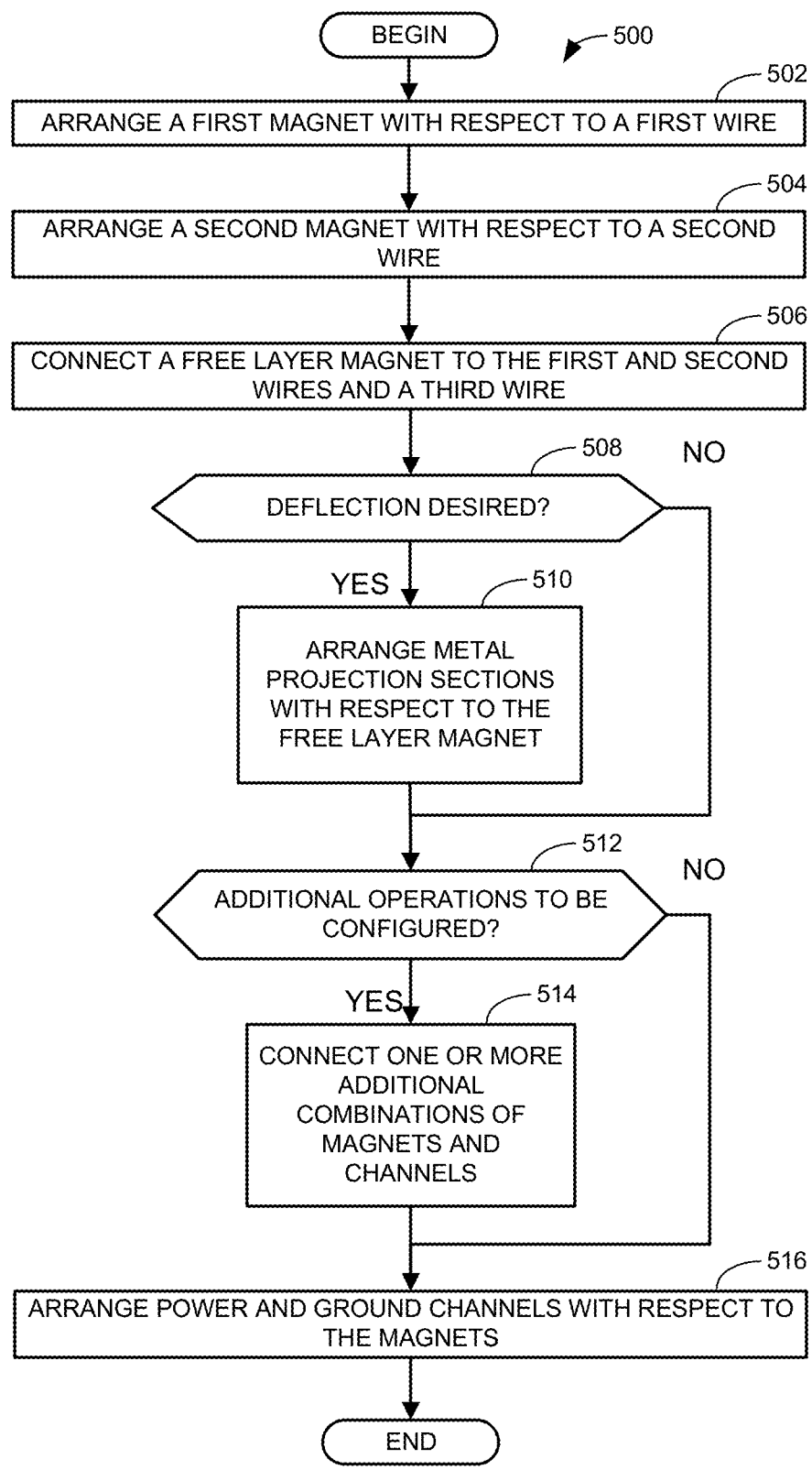
FIG. 5 is a flowchart representative of an example method to produce the example device of FIGS. 4A-4F.

FIG. 5 is a flowchart representative of an example method 500 to produce the example device 400-409 of FIGS. 4A-4F. The example method 500 of FIG. 5 begins when the device 400-409 is being constructed. In particular, multiple layers are being placed (e.g., stacked and/or applied/deposited) to define the device 400-409. In this example, numerous applications of materials and/or coatings along with numerous etching and/or exposure processes are being used to produce and/or define the device 400-409.

In this example, at block 502, the first magnet 402 is arranged with respect to an input and a first wire (e.g., channel 408). For example, an input can facilitate application of a voltage and/or capacitor discharge to form a current in the first magnet 402 based on the shape of the first magnet 402, which dictates is preferred direction of magnetization to produce spin polarized carriers along the first wire.

At block 504, the second magnet 404 is arranged with respect to a second wire (e.g., channel 410, 412). The second magnet 404 can also be connected to the first wire. Based on the shape of the second magnet 404, the second magnet 404 can generate spin polarized carriers along the second wire.

At block 506, the free layer magnet 406 is connected to the first wire and the second wire as well as a third wire (e.g., channel 416) to provide an output. The free layer magnet 406 is shaped such that no preferred direction of magnetization is provided by the magnet 406. Thus, the polarization of the magnet 406 is shaped by the spin polarized carriers received from the first and second wires.

If, at block 508, spin polarized carrier deflect is desired, then, at block 510, metal projection sections (e.g., metal sections 434, 436) are arranged with respect to the free layer magnet 406. The metal projection sections deflect spin polarized carriers flowing from the magnet 406 from one direction to another direction (e.g., from the x direction to they direction, from they direction to the x direction, etc.).

If, at block 512, additional mathematical operations are to be configured, then, at block 514, one or more additional combinations of polarized magnets 402, 404 and free layer magnet 406 can be connected to the initial configuration of magnets 402, 404, 406 and channels 408, 410, 412, 416 to generate a plurality of complex number outputs. Output vectors can be propagated individually and/or combined into one or more scalar products, vector products, etc.

At block 516, power and ground channels are arranged with respect to the first magnet 402, second magnet 404, and free layer magnet 406 to generate a current to flow from the magnets 402, 404 to the magnet 406 via the channels 408, 410, 412, 416 to provide an output number (e.g., a complex number) represented by spin polarized carriers generated when the current flows through the magnets 402, 404, 406. The magnet 406 can be configured to allow additional current to flow through the magnet 406 to multiply a vector formed from spin polarized carriers at magnets 402, 404 by a scalar value corresponding to an amount of the current applied to the magnet 406 (e.g., as a result of a voltage and/or capacitor discharge applied between the power and ground channels 308, 310).

As described above, a flowchart representative of an example method for implementing the examples disclosed herein is shown in FIG. 5. The example methods may be implemented by machine readable instructions that comprise a program(s) for execution by a processor such as the processor 612 shown in the example processor platform 600 discussed below in connection with FIG. 6. The program may be embodied in software stored on a tangible computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowchart illustrated in FIG. 5, many other methods of implementing the examples disclosed herein may alternatively be used. For example, the order of execution of the blocks may be changed, and/or some of the blocks described may be changed, eliminated, or combined.

As mentioned above, the example method of FIG. 5 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example method of FIG. 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 6:
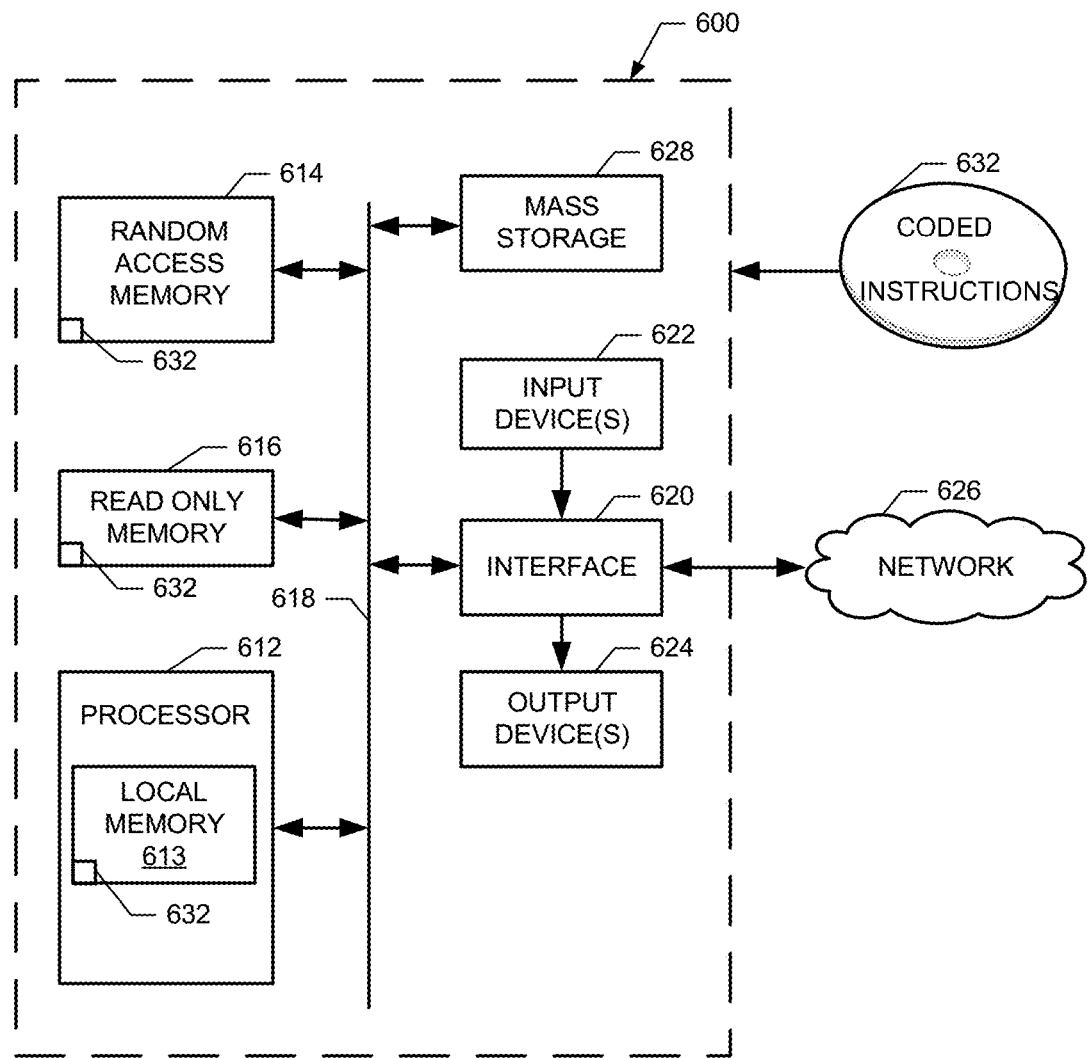
FIG. 6 is a processor platform that may be used to execute the example method of FIG. 5.

FIG. 6 is a block diagram of an example processor platform 600 capable of executing the instructions of FIG. 5 to implement the examples disclosed herein. The processor platform 600 can be, for example, a semiconductor fabrication device, a wafer/die production controller, a wafer producing/processing device, a die/wafer etching device, a server, a personal computer, a mobile device (e.g., a cell phone, a smart phone, a tablet such as an iPad™), a personal digital assistant (PDA), an Internet appliance, a set top box, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and commands into the processor 612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

The coded instructions 632 of FIG. 5 may be stored in the mass storage device 628, in the volatile memory 614, in the non-volatile memory 616, and/or on a removable tangible computer readable storage medium such as a CD or DVD.

From the foregoing, it will be appreciated that the above disclosed methods, apparatus and articles of manufacture allow complex numbers to be generated, represented, stored, propagated, and manipulated using a semiconductor device. The disclosed examples also allow mathematical operations, such as scalar multiplication, scalar product computation, vector product computation, etc., to be computed using the semiconductor device.

Example 1 includes a logic device including a first magnet with a first preferred direction of magnetization that is connected to a first wire, wherein the first magnet polarizes in the first direction a spin of electrons of a first current that passes through the first magnet. The logic device of example 1 includes a second magnet with a second preferred direction of magnetization that is connected to a second wire, wherein the second magnet polarizes in the second direction a spin of electrons of a second current that passes through the second magnet, wherein the second wire is further connected to the first wire. The logic device of example 1 includes a third magnet providing a free layer without a preferred direction of magnetization that is connected to the first and second wires, wherein the third magnet encodes a vector based on a flux of electrons spin polarized in the first direction and a flux of electrons spin polarized in the second direction that diffuse into the third magnet.

Example 2 includes the subject matter of example 1, wherein the first wire and the second wire are the same wire.

Example 3 includes the subject matter of example 1, wherein the preferred direction of magnetization is based on a shape of the magnet.

Example 4 includes the subject matter of example 1, wherein the first magnet and second magnet include a ferromagnetic alloy.

Example 5 includes the subject matter of example 1, further including a third wire connected to the third magnet, wherein the electrons spin polarized in the first direction and the electrons spin polarized in the second direction passing through the third magnet to form the encoded vector are multiplied by a scalar number corresponding to a third current applied via the third wire.

Example 6 includes the subject matter of example 1, further including a fourth magnet with the first preferred direction of magnetization which polarizes in the first direction the spin of the electrons of a fourth current further carried in a fourth wire, and a fifth magnet with the second preferred direction of magnetization which polarizes in the second direction the spin of the electrons of a fifth current further carried in a fifth wire, wherein the first and second wires are connected to the fourth and fifth wires and the spin polarized electrons of the first, second, fourth, and fifth currents diffuse into the third magnet to add a first vector composed of the first and second currents, and a second vector composed the fourth and fifth currents.

Example 7 includes the subject matter of example 7, wherein the spin polarized electrons of the first, second, fourth and fifth currents diffusing into the third magnet subtracts the first and second vectors.

Example 8 includes the subject matter of example 1, further including a first deflection section subsequent to the third magnet and further connected to a sixth wire, and a second deflection section subsequent to the third magnet and further connected to a seventh wire, wherein electrons spin polarized in the first direction flow through the first deflection section to the sixth wire to project a first component of the encoded vector and electrons spin polarized in the second direction flow through the second deflection section to the seventh wire to project a second component of the encoded vector.

Example 9 includes the subject matter of example 8, wherein the first deflection section and the second deflection section include spin orbit coupling material.

Example 10 includes the subject matter of example 1, wherein the flux of electrons spin polarized in the first direction and the flux of electrons spin polarized in the second direction from the third magnet operate with an additional magnet to form at least one of a scalar product or a vector product of complex numbers.

Example 11 includes a method of producing a logic device, the method including arranging a first magnet with a first preferred direction of magnetization that is connected to a first wire, wherein the first magnet polarizes in the first direction a spin of electrons of a first current that passes through the first magnet. The method of example 11 includes arranging a second magnet with a second preferred direction of magnetization that is connected to a second wire, wherein the second magnet polarizes in the second direction a spin of electrons of a second current that passes through the second magnet, wherein the second wire is further connected to the first wire. The method of example 11 includes arranging a third magnet providing a free layer without a preferred direction of magnetization that is connected to the first and second wires, wherein the third magnet encodes a vector based on a flux of electrons spin polarized in the first direction and a flux of electrons spin polarized in the second direction that diffuse into the third magnet.

Example 12 includes the subject matter of example 11, wherein the first wire and the second wire are the same wire.

Example 13 includes the subject matter of example 11, wherein the preferred direction of magnetization is based on a shape of the magnet.

Example 14 includes the subject matter of example 11, wherein the first magnet and second magnet include a ferromagnetic alloy.

Example 15 includes the subject matter of example 11, further including connecting a third wire to the third magnet, wherein the electrons spin polarized in the first direction and the electrons spin polarized in the second direction passing through the third magnet to form the encoded vector are multiplied by a scalar number corresponding to a third current applied via the third wire.

Example 16 includes the subject matter of example 11, further including arranging a fourth magnet with the first preferred direction of magnetization which polarizes in the first direction the spin of the electrons of a fourth current further carried in a fourth wire, and a fifth magnet with the second preferred direction of magnetization which polarizes in the second direction the spin of the electrons of a fifth current further carried in a fifth wire, wherein the first and second wires are connected to the fourth and fifth wires and the spin polarized electrons of the first, second, fourth, and fifth currents diffuse into the third magnet to add a first vector composed of the first and second currents, and a second vector composed the fourth and fifth currents.

Example 17 includes the subject matter of example 16, wherein the spin polarized electrons of the first, second, fourth and fifth currents diffusing into the third magnet subtracts the first and second vectors.

Example 18 includes the subject matter of example 16, further including arranging a first deflection section subsequent to the third magnet and further connected to a sixth wire, and a second deflection section subsequent to the third magnet and further connected to a seventh wire, wherein electrons spin polarized in the first direction flow through the first deflection section to the sixth wire to project a first component of the encoded vector and electrons spin polarized in the second direction flow through the second deflection section to the seventh wire to project a second component of the encoded vector.

Example 19 includes the subject matter of example 18, wherein the first deflection section and the second deflection section include spin orbit coupling material.

Example 20 includes a processor including a first ferromagnet having a first dimension longer than a second dimension with a first direction of magnetization along an axis of the first dimension, wherein the first ferromagnet polarizes a spin of electrons in the first direction to form first polarized spin carriers. The example processor of example 20 includes a second ferromagnet having a third dimension longer than a fourth dimension with a second direction of magnetization along an axis of the third dimension, wherein the second ferromagnet polarizes a spin of electrons in the second direction to form second polarized spin carriers. The example processor of example 20 includes a free layer magnet forming a vector encoding a complex number based on the first polarized spin carrier and the second polarized spin carriers.

Example 21 includes the subject matter of example 20, wherein the first polarized spin carriers and the second polarized spin carriers from the free layer magnet operate with a third magnet to form at least one of a scalar product or a vector product of complex numbers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. A logic device comprising:
   a first magnet with a first preferred direction of magnetization connected to a first wire, the first magnet to polarize, in the first direction, a spin of electrons of a first current through the first magnet;
   a second magnet with a second preferred direction of magnetization connected to a second wire, the second magnet to polarize, in the second direction, a spin of electrons of a second current through the second magnet, wherein the second wire is connected to the first wire; and
   a third magnet comprising a free layer without a preferred direction of magnetization connected to the first and second wires, the third magnet to encode a vector based on a flux of electrons spin polarized in the first direction and a flux of electrons spin polarized in the second direction.

2. The logic device of claim 1, wherein the first wire and the second wire are the same wire.

3. The logic device of claim 1, wherein the first and second preferred directions of magnetization are based on shapes of the first and second magnets, respectively.

4. The logic device of claim 1, wherein the first and second magnets comprise a ferromagnetic alloy.

5. The logic device of claim 1, further comprising:
   a third wire connected to the third magnet, wherein the electrons spin polarized in the first direction and the electrons spin polarized in the second direction are to pass through the third magnet to form the encoded vector multiplied by a scalar number corresponding to a third current applied via the third wire.

6. The logic device of claim 1, further comprising:
   a fourth magnet with the first preferred direction of magnetization to polarize, in the first direction, the spin of electrons of a fourth current carried in a fourth wire; and
   a fifth magnet with the second preferred direction of magnetization to polarize, in the second direction, the spin of electrons of a fifth current carried in a fifth wire, the first and second wires are connected to the fourth and fifth wires and the spin polarized electrons of the first, second, fourth, and fifth currents are to diffuse into the third magnet to add a first vector composed of the first and second currents and a second vector composed of the fourth and fifth currents.

7. The logic device of claim 6, wherein the spin polarized electrons of the first, second, fourth, and fifth currents to diffuse into the third magnet is to subtract the first and second vectors.

8. The logic device of claim 1, further comprising:
   a first deflection section subsequent to the third magnet and connected to a sixth wire; and
   a second deflection section subsequent to the third magnet and connected to a seventh wire, wherein electrons spin polarized in the first direction are to flow through the first deflection section to the sixth wire to project a first component of the encoded vector and electrons spin polarized in the second direction are to flow through the second deflection section to the seventh wire to project a second component of the encoded vector.

9. The logic device of claim 8, wherein the first deflection section and the second deflection section comprise spin orbit coupling material.

10. The logic device of claim 1, wherein the flux of electrons spin polarized in the first direction and the flux of electrons spin polarized in the second direction from the third magnet are to operate with an additional magnet to form at least one of a scalar product or a vector product of complex numbers.

11. A method of producing a logic device comprising:
    arranging a first magnet with a first preferred direction of magnetization connected to a first wire, the first to polarize, in the first direction, a spin of electrons of a first current through the first;
    arranging a second magnet with a second preferred direction of magnetization connected to a second wire, the second magnet to polarize, in the second direction, a spin of electrons of a second current through the second magnet, wherein the second wire is connected to the first wire; and
    arranging a third magnet comprising a free layer without a preferred direction of magnetization connected to the first and second wires, the third magnet to encode a vector based on a flux of electrons spin polarized in the first direction and a flux of electrons spin polarized in the second direction.

12. The method of claim 11, the first wire and the second wire are the same wire.

13. The method of claim 11, wherein the first and second preferred directions of magnetization are based on shapes of the first and second magnets, respectively.

14. The method of claim 11, further comprising:
    connecting a third wire to the third magnet, wherein the electrons spin polarized in the first direction and the electrons spin polarized in the second direction are to pass through the third magnet to form the encoded vector multiplied by a scalar number corresponding to a third current applied via the third wire.

15. The method of claim 11, further comprising:
    arranging a fourth magnet with the first preferred direction of magnetization to polarize, in the first direction, the spin of electrons of a fourth current further in a fourth wire and a fifth magnet with the second preferred direction of magnetization to polarize, in the second direction, the spin of electrons of a fifth current carried in a fifth wire, wherein the first and second wires are connected to the fourth and fifth wires and the spin polarized electrons of the first, second, fourth, and fifth currents are to diffuse into the third magnet to add a first vector composed of the first and second currents and a second vector composed the fourth and fifth currents.

16. The method of claim 15, wherein the spin polarized electrons of the first, second, fourth, and fifth currents to diffuse into the third magnets to subtract the first and second vectors.

17. The method of claim 11, further comprising:
arranging a first deflection section subsequent to the third magnet and connected to a sixth wire and a second deflection section subsequent to the third magnet and connected to a seventh wire, wherein electrons spin polarized in the first direction are to flow through the first deflection section to the sixth wire to project a first component of the encoded vector and electrons spin polarized in the second direction are to flow through the second deflection section to the seventh wire to project a second component of the encoded vector.

18. The method of claim 17, wherein the first deflection section and the second deflection section comprise spin orbit coupling material.

19. A processor comprising:
a first ferromagnet having a first dimension longer than a second dimension with a first direction of magnetization along an axis of the first dimension, the first ferromagnet to polarize a spin of electrons in the first direction to form first polarized spin carriers;
a second ferromagnet having a third dimension longer than a fourth dimension with a second direction of magnetization along an axis of the third dimension, the second ferromagnet to polarize a spin of electrons in the second direction to form second polarized spin carriers; and
a free layer magnet to form a vector encoding a complex number based on the first polarized spin carrier and the second polarized spin carriers.

20. The processor of claim 19, wherein the first polarized spin carriers and the second polarized spin carriers from the free layer magnet operate with a third magnet to form at least one of a scalar product or a vector product of complex numbers.

* * * * *